(12) United States Patent
Sanderford, Jr. et al.

(10) Patent No.: US 7,511,470 B2
(45) Date of Patent: Mar. 31, 2009

(54) ELECTRONIC TAMPER DETECTION CIRCUIT FOR AN ELECTRICITY METER

(75) Inventors: H. Britton Sanderford, Jr., New Orleans, LA (US); Stephen Schamber, Baton Rouge, LA (US)

(73) Assignee: M&FC Holding, LLC, Wilmington, DE (US)

( * ) Notice: Subject to any disclaimer, the term of this patent is extended or adjusted under 35 U.S.C. 154(b) by 129 days.

(21) Appl. No.: 11/668,180

(22) Filed: Jan. 29, 2007

(65) Prior Publication Data

US 2008/0180088 A1    Jul. 31, 2008

(51) Int. Cl.
*G01R 1/00* (2006.01)
*H02B 1/20* (2006.01)
*H02B 1/00* (2006.01)

(52) U.S. Cl. .................. 324/110; 361/654; 361/672

(58) Field of Classification Search ............ 324/110; 340/637, 870.02; 702/62; 361/654, 672
See application file for complete search history.

(56) References Cited

U.S. PATENT DOCUMENTS

| | | | |
|---|---|---|---|
| 4,150,371 A | 4/1979 | Scaglione |
| 4,357,601 A | 11/1982 | McWilliams |
| 4,833,455 A | 5/1989 | Bishop |
| 5,140,258 A | 8/1992 | Bishop |
| 5,293,115 A | 3/1994 | Swanson |
| 5,422,565 A | 6/1995 | Swanson |
| 5,473,322 A | 12/1995 | Carney |
| 5,488,565 A | 1/1996 | Kennon et al. |
| 5,523,559 A | 6/1996 | Swanson |
| 5,940,009 A | 8/1999 | Loy et al. |
| 6,118,269 A | 9/2000 | Davis |
| 6,362,745 B1 | 3/2002 | Davis |
| 6,523,013 B2 | 2/2003 | Shah et al. |
| 6,844,825 B2 | 1/2005 | Shincovich |
| 6,852,935 B2 | 2/2005 | Higgins et al. |

OTHER PUBLICATIONS

"MSP430x13x, MSP430x14x. MSP430x14x1 Mixed Signal Microcontroller", Texas Instruments, SLAS272F—Jul. 2000—Revised Jun. 2004.

*Primary Examiner*—Ha Tran T Nguyen
*Assistant Examiner*—Roberto Velez
(74) *Attorney, Agent, or Firm*—Andrus, Sceales, Starke & Sawall, LLP (57) ABSTRACT

An electronic meter tamper detection system and method for sensing the removal of an electricity meter from a meter socket and generating a tamper signal when such removal is detected. The tamper detection circuit includes a control unit having an energy storage device that is charged during normal operation of the electricity meter. When power is interrupted to the electricity meter, the control unit applies a charging voltage to a voltage regulating device within the electricity meter. The voltage regulating device can be charged only when the electricity meter is installed within the meter socket. After applying the charging voltage to the voltage regulating device, the control unit senses whether the voltage regulating device has been charged. If the voltage regulating device has not been charged, the control unit indicates that the meter has been removed from the meter socket.

11 Claims, 5 Drawing Sheets

ELECTRONIC TAMPER DETECTION CIRCUIT FOR AN ELECTRICITY METER

FIELD OF THE INVENTION

The present invention relates to utility metering systems that allow a utility to monitor energy consumption. More specifically, the present invention relates to a system and method for detecting the removal of or the tampering with an electricity meter connected to a power line system.

BACKGROUND OF THE INVENTION

Utility meters are used for billing services provided by public utilities such as electricity, gas and water. For example, kilowatt-hour meters, located on a customer premise, include detachable meter units for measuring and recording electric power consumption by the subscriber. Typically, a kilowatt-hour meter is provided at each of the subscriber locations. A typical kilowatt-hour meter includes either a rotating disk or a completely electronic circuit that monitors the energy consumption within the subscriber location. Meter-reading personnel periodically inspect each subscriber site and record utility meter readings, either by hand or using an electronic probe to retrieve data stored in the solid state memory of the meter. Billing information is generated based upon the data collected by the meter reader.

Presently, utility meters are available that include interface equipment to permit remote interrogation of the meter and transmission of the collected usage data. The connectivity between the utility meters located at the subscriber site and the central billing facility can be provided using various different methods of communication, such as power line communication, dedicated signaling lines, the public telephone network or RF transmissions between meters and remote gateways in communication with the utility.

As a result of increased utilization of automatic remote reading of utility meters, there has been a decrease in the frequency of on-site inspection of metering equipment. The reduction in the number of actual physical visits to a customer site has increased the opportunities for undetected tampering with the metering equipment.

Presently, most single phase and polyphase electricity meters in the United States are socket mounted. The electricity meter includes a series of blade contacts that fit within a socket assembly, which allows the meter to be easily removed and replaced for servicing. However, the ease of removal and replacement also increases the likelihood that the meter can be removed from the meter socket and tampered with. One type of tampering with the meter is to remove the meter and reinstall the meter upside down, resulting in reverse rotation of the internal meter disk and register dials that record cumulative energy consumption.

Prior generations of electricity meters employed mechanical techniques to sense the installation of a meter and included a counter sealed beneath the meter cover that recorded and displayed the number of times the meter had been removed and reinstalled. Later generations of electricity meters employed mechanical tilt switches and logic elements to sense removal and/or reorientation of the meter.

Although mechanical switches have proven effective at sensing removal and reinstallation of the meter when the meter is reinstalled upside down, these techniques are not able to reliably sense meter removal from the socket when a reasonable attempt is made to maintain the meter in its normal orientation. Further, if the tilt switch is made overly sensitive, the system will falsely report tampering in response to normal events.

Therefore, a need exists for an improved tamper detection method that allows the meter to sense when the meter has been removed from the socket and relay information relating to the detected tampering back to the utility for remote sensing.

SUMMARY OF THE INVENTION

The present invention relates to a system and method for detecting the removal of an electricity meter from a meter socket by utilizing an internal voltage regulating device contained within the electricity meter. The control unit monitors for the removal of the electricity meter from the meter socket and signals the meter removal following an interruption of power to the electricity meter.

The electricity meter includes a tamper detection circuit that is positioned between the voltage source supplying the meter and a voltage regulating device contained within the meter and operable to reduce the voltage source to an output voltage that can be utilized by the subscriber. In the preferred embodiment of the invention, the voltage regulating device is a regulating capacitor contained within the meter. Upon a detection of the interruption in electrical power to the electricity meter, which may be from a tampering event or a power outage, the regulating capacitor discharges through a voltage sensing circuit. Following a delay period to permit the complete discharge of the regulating capacitor, the control unit of the electricity meter activates a switching device positioned between an energy storage device and the voltage regulating device. If the electricity meter is correctly installed within the meter socket, the energy storage device charges the voltage regulating device during a charging period when the switching device is in the closed condition.

After the control voltage has been applied to the switching device to cause the switching device to remain in the closed condition for a charging period, the control voltage is removed, causing the switching device to return to its open condition. When the switching device is in the open condition, the voltage regulating device discharges through the voltage sensing circuit. The control unit monitors the value of the voltage sensing circuit to determine whether the voltage regulating device is discharging. If the voltage regulating device is discharging, as indicated by a high voltage across the voltage sensing circuit, the electricity meter is within the meter socket. However, if the voltage regulating device is not discharging, as indicated by a low voltage across the voltage sensing circuit, the voltage regulating device was not charged by the energy storage device during the charging period due to the removal of the electricity meter from the meter socket. If the control unit determines that the regulating capacitor has not been charged, the control unit generates a signal indicating that the meter has been tampered with or removed from the meter socket.

BRIEF DESCRIPTION OF THE DRAWINGS

The drawings illustrate the best mode presently contemplated of carrying of the invention. In the drawings.

DETAILED DESCRIPTION OF THE INVENTION

Figure 1:
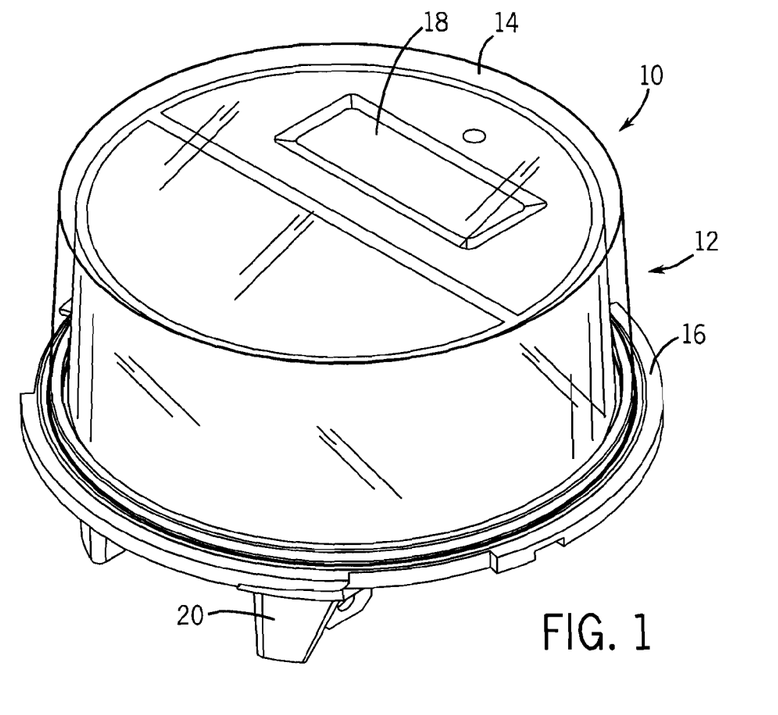
FIG. 1 is a perspective view of an electronic electricity meter embodying the features of the present invention.

FIG. 1 illustrates an electronic electricity meter 10 that includes the tamper detection circuitry of the present invention. The electricity meter 10 shown in FIG. 1 includes an enclosed housing 12 having a plastic cover 14 and a meter base 16. The clear plastic cover 14 encloses the operating components of the electricity meter, including a display 18 and the measuring components for the electricity meter. The cover member 14 and the base 16 are joined to each other in a conventional manner such that the base 16 and the cover member 14 define a sealed, water resistant meter housing. The meter housing prevents moisture and other environmental contaminants from reaching the internal circuitry contained within the electricity meter 10.

In the present invention, an operating and measurement circuit is contained within the meter housing and operates to control the digital display 18. The specific details of the measurement circuit will not be described, since the measurement circuitry forms no part of the present invention. However, it should be understood that the measurement circuit is well known to those skilled in the art and can vary depending upon the type of information required from the electricity meter 10, which is typically dictated by the utility service provider. In the preferred embodiment of the invention, the electricity meter 10 includes an internal radio that allows the electricity meter to remotely report consumption information to the utility provider. An example of the electricity meter 10 is the iCon APX meter available from Sensus Metering Systems, Inc.

Figure 2:
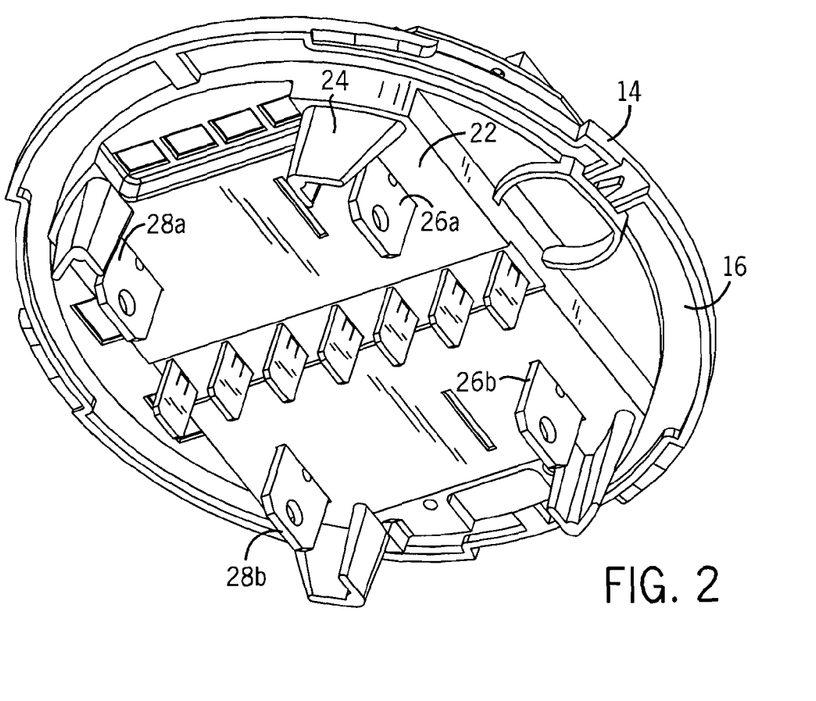
FIG. 2 is a back perspective view of the meter base illustrating the configuration of the base, including a series of bus bars, to permit the meter to be installed in a meter socket.

Referring now to FIG. 2, thereshown is a bottom view of the base 16 of the electricity meter of the present invention. As illustrated in FIG. 2, the base member includes a generally planar base plate 22 that includes a plurality of support legs 24 evenly spaced around the base plate. The support legs 24 stabilize the electricity meter 10 when the electricity meter is installed in the mating meter socket positioned in-line with a supply of electricity to either a residential or commercial location. The support legs 24 are typically formed from molded plastic and are formed integrally with the remaining portions of the base 16. As shown in FIG. 2, the base member 16 is configured in accordance with ANSI standards such that the electricity meter can be installed within a corresponding ANSI-rated meter socket that can be inserted into various forms of electric service.

The base 16 of the electricity meter is configured to have a first pair of sensing blades 26a, 26b and a second pair of sensing blades 28a, 28b. The sensing blades are typically configured as current sensing blades and form parts of two bus bars that are securely mounted to a circuit board including operating components such that the operating components of the circuit board can monitor for the amount of electricity consumed by the facility that the electricity meter 10 is monitoring. The measurement circuitry mounted within the electricity meter senses the amount of current flowing through the electricity meter and is shown in U.S. Pat. No. 6,414,475, the disclosure of which is incorporated by reference.

Figure 3:
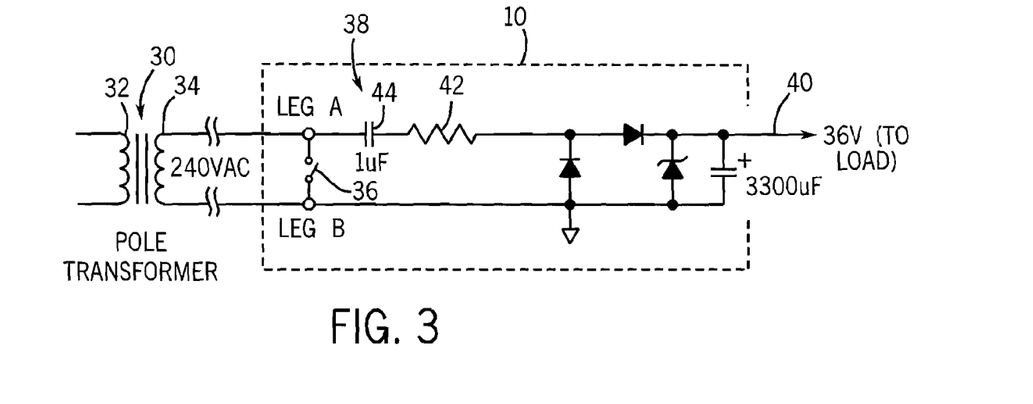
FIG. 3 is a schematic illustration of the connection of the electricity meter between a voltage source and an electrical load at a subscriber location.

Referring now to FIG. 3, thereshown is a simple schematic illustration of the installation of the electricity meter 10 at a subscriber location. The illustration of FIG. 3 simplifies the circuitry of the electricity meter. As illustrated in FIG. 3, power is supplied to a pole transformer 30 having a primary winding 32 and second winding 34. Typically, the pole transformer will be located near the subscriber residence and will step down the supply voltage present on the primary winding 32 to the second voltage on the secondary winding 34. In the embodiment shown in FIG. 3, the voltage across the secondary winding 34 has a value of 240 volts AC, as illustrated.

The electricity meter 10 receives the secondary voltage as a voltage source across legs A and B of the bus bar. As illustrated in FIG. 3, legs A and B of the bus bar are connected to each other through the meter socket, which is illustrated in FIG. 3 as switch 36. It should be understood that the switch 36 represents the connection between the two legs of the bus bar through the meter socket and is in the closed position only when the meter is installed within the meter socket.

In the electricity meter 10 of the present invention, a voltage regulating device 38 is positioned in series with the voltage source to drop the 240 volt AC voltage to a more usable value for the subscriber, as illustrated by the output voltage 40 in FIG. 3. In the embodiment shown in FIG. 3, the voltage regulating device 38 is a regulating capacitor 44 having a value of 1 μF, which generates the output voltage 40 of approximately 36 volts. Resistor 42 is shown in the simplified circuit of FIG. 3 to replicate the resistance within the electricity meter 10.

As can be understood in FIG. 3, when the electricity meter is installed within the meter socket, the switch 36 is in the closed position, which provides a path to the ground potential, thus allowing the charging of the regulating capacitor 44. If the electricity meter 10 is removed from the meter socket, the switch 36 is moved to the open position, thus preventing the regulating capacitor 44 from receiving any additional charge. This feature of the internal configuration of the electricity meter 10 will be used to determine whether the electricity meter has been tampered with, and specifically whether the electricity meter has been removed from the meter socket.

Figure 4:
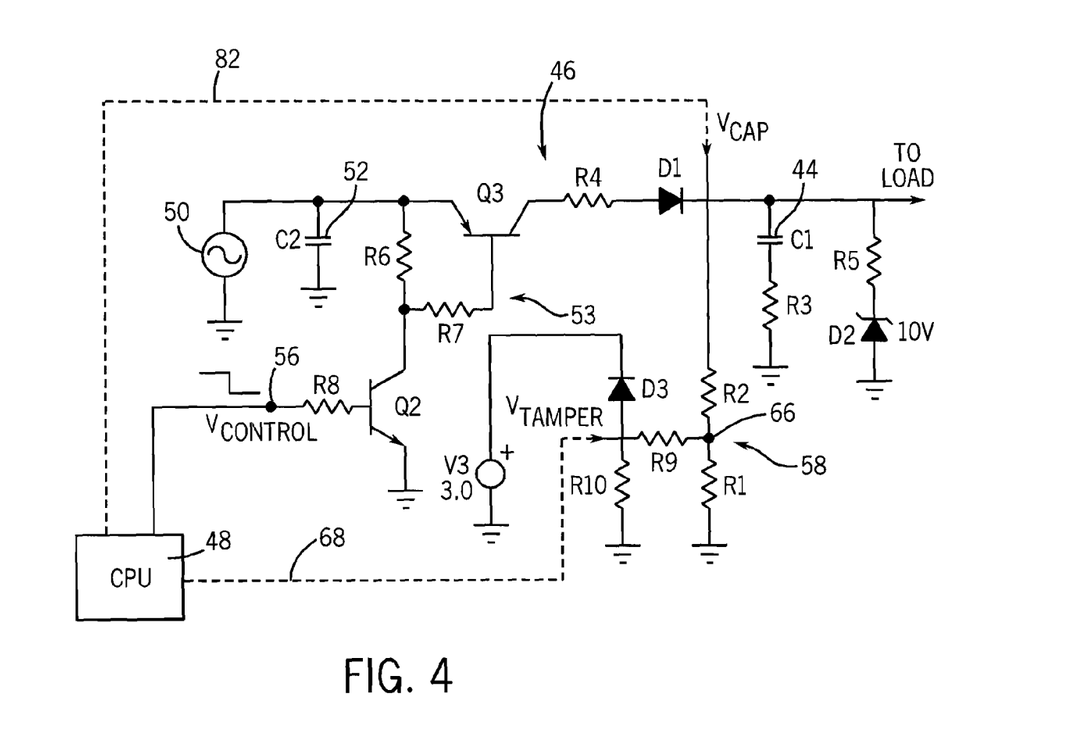
FIG. 4 is a circuit diagram of the electronic tamper detection circuit of the present invention.

Referring now to FIG. 4, thereshown is a tamper detection circuit 46 of the present invention. The tamper detection circuit 46 is operable to determine whether the electricity meter has been removed from the meter socket after the detection of power interruption to the electricity meter. It is important to note that interruption of electric power to the electricity meter can be the result of legitimate power interruption, which needs to be distinguished from the interruption of power to the electricity meter due to the removal of the electricity meter from the meter socket.

As illustrated in FIG. 4, the electricity meter includes a control unit 48 that forms the energy consumption monitoring and reporting circuit within the electricity meter 10 as previously described. The meter control unit 48 is positioned on a circuit board mounted within the housing of the electricity meter and monitors the current consumption of the electrical load at the subscriber location and displays the electricity consumption on a display device. Further, in the electricity meter 10 of the present invention, the control unit 48 also controls the reporting of information to the utility provider, such as through an RF radio signal transmission.

As illustrated in FIG. 4, the voltage source 50, which represents the secondary side 34 of the pole transformer 30 shown in FIG. 3, charges the regulating capacitor 44 through the tamper detection circuit 46. As described with reference to FIG. 3, the regulating capacitor 44 forms a voltage regulating device to provide the load with a voltage can be used within the subscribed location.

During normal operation when electric power is being provided to the electricity meter, the voltage source 50 charges an energy storage device 52, which is illustrated in FIG. 4 as being a capacitor C2. The energy storage device 52, although shown separate from the control unit 48, is preferably connected to the control unit 48 and provides a source of electrical power for the control unit should the voltage source 50 be removed from the electricity meter. In the preferred embodiment of the invention, the energy storage device 52 is a capacitor that maintains a charge of between 24.7 volts and 27.3 volts.

During normal operation of the electricity meter, the control unit 48 provides a high signal to a switching device 53 positioned between the voltage source 50 and the regulating capacitor 44 to maintain the switching device 53 in a closed condition. Specifically, the control unit 48 provides a high signal to the transistor Q2, which saturates the transistor Q2 causing the transistor Q2 to form a path to ground. When the transistor Q2 is in the "on" state, transistor Q2 provides a path to ground, thus saturating transistor Q3, resulting in the transistor Q3 also being in the "on" state. When the transistor Q3 is in the "on" state, the voltage source 50 is coupled to the regulating capacitor 44, allowing the voltage source 50 to charge the regulating capacitor 44 and develop the voltage to the load as required. The resistor R3 shown in FIG. 4 represents the resistance of the meter socket when the electricity meter is properly installed. If the electricity meter is removed, the resistor R3 is removed, thus preventing the charging of the regulating capacitor 44.

Figure 8:
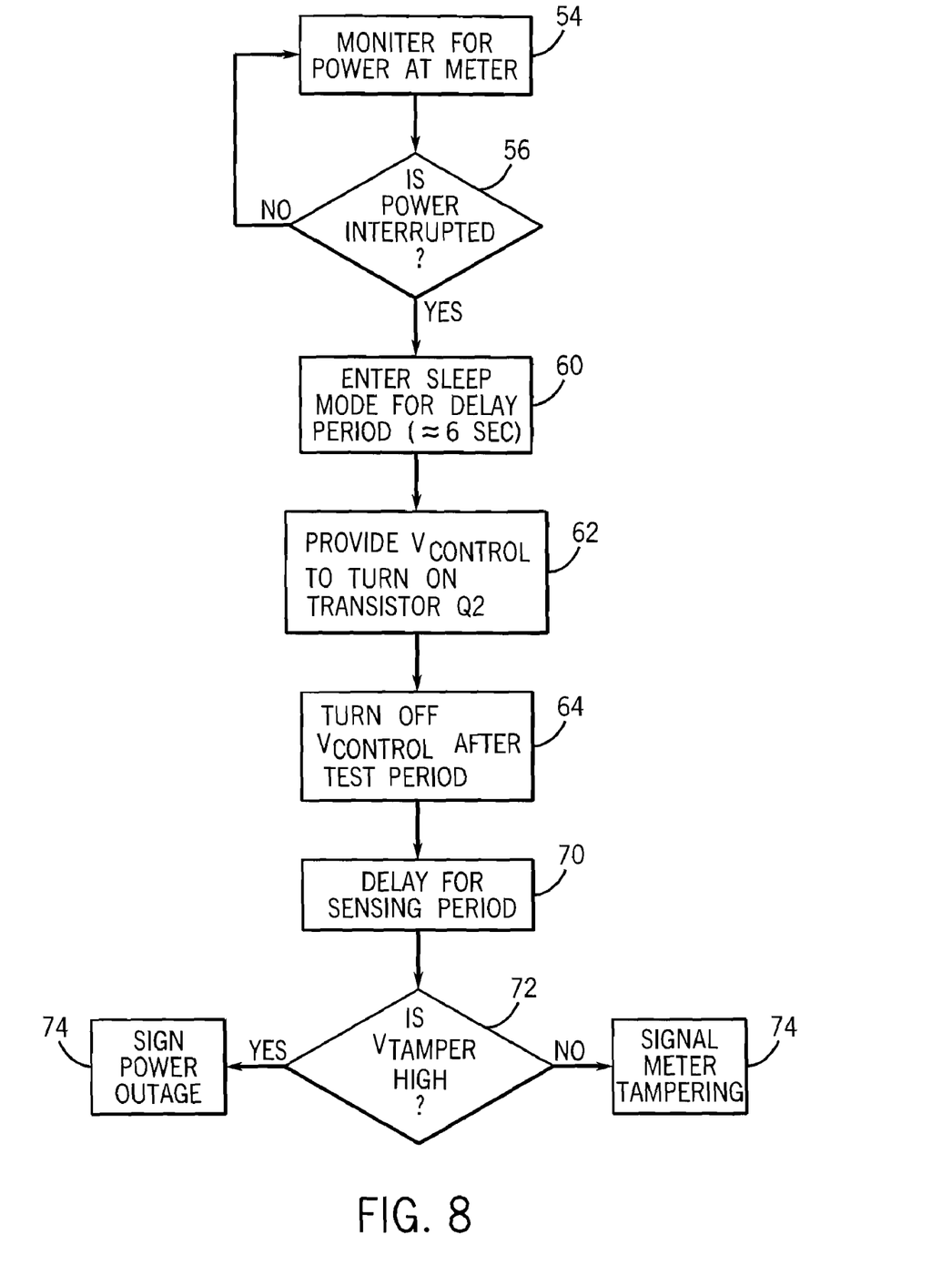
FIG. 8 is a flowchart illustrating the operation of the control unit within the electricity meter to determine whether the electricity meter has been removed from the meter socket.

Referring now to FIGS. 4 and 8, the operation of the tamper detection circuit 46 will now be described. Initially, the control unit 48 monitors for the presence of electrical power at the meter, as illustrated in step 54. If the control unit 48 determines in step 56 that power is present at the electricity meter, the control unit continues to monitor for the presence of electrical power. However, if the control unit determines in step 56 that power has been interrupted, the control unit enters into a sleep mode to conserve electrical power for a delay period. As described previously, the interruption of electrical power can be the result of many different situations, such as electrical power outage in the area of the electricity meter, severed power lines leading to the subscriber residence or the removal of the electricity meter from the meter socket.

Referring back to FIG. 4, when the voltage source 50 is removed from the circuit during the power interruption, the control unit 48 enters the sleep mode, which removes the control voltage ($V_{control}$) present at the base 56 of the transistor Q2 through resistor R8. With the base voltage removed, the transistor Q2 turns off and functions as an open circuit, thus resulting in the transistor Q3 turning off and also acting as an open circuit.

Upon initial power interruption and deactivation of the switching device 53, the regulating capacitor 44 is fully charged and begins to discharge through a voltage sensing circuit 58 including the pair of series resistors R2 and R1. In the embodiment illustrated, the discharge time (t) of the capacitor 44 will be defined by (R1+R2)C1. In the embodiment of the invention, the control unit 48 enters into the sleep mode of step 60 in FIG. 8 for a delay period that is greater than the discharge time (t) required for the regulating capacitor 44. In the embodiment of the invention illustrated, the control unit 48 enters into the sleep mode for a delay period of approximately six seconds. Following the six second delay, the regulating capacitor 44 will have fully discharged through the voltage sensing circuit 58 and will have very little charge remaining from the voltage source 50.

After the interruption of power to the electricity meter and the expiration of the delay period, the control unit 48 will then utilize the tamper detection circuit 46 to determine whether the electricity meter has been removed from the meter socket. Initially, the control unit provides a control voltage ($V_{control}$) to the switching device 53, namely to the node 56 at the base of transistor Q2. The control voltage present at the base of the transistor Q2 will cause both the transistor Q2 and Q3 to turn on. As described previously, the energy storage device 52 has a stored charge which will be applied to the regulating capacitor 44 through the switching device 53. If the electricity meter remains within the meter socket, the resistor R3, which represents the equivalent resistance of the meter base between the bus bars, will be present, thus providing a connection to ground for regulating capacitor 44. If the meter has been removed from the meter socket, the resistor R3 will not be present, thus resulting in an open circuit and preventing the regulating capacitor 44 from being charged by the energy storage device 52. Thus, the resistor R3 shown in FIG. 4 represents the switch 36 shown in FIG. 3 and will be in an "open" state when the meter has been removed from the socket.

Referring back to FIG. 8, after the control unit has provided the $V_{control}$ signal to turn on the transistor Q2 in step 62, the control unit will then remove the $V_{control}$ voltage after the expiration of a test period, as illustrated by step 64. In the preferred embodiment of the invention, the test period is approximately 25 ms, which is enough time to charge the regulating capacitor 44 yet small enough to preserve the charge on the energy storage device 52.

Referring back to FIG. 4, when the control voltage present at node 56 is removed, the switching device 53 returns to the open condition and both of the transistors Q2 and Q3 return to an "off" state, which prevents further charging of the capacitor 44. When both of the transistors Q2 and Q3 are turned off, the regulating capacitor 44 beings to discharge through the voltage sensing circuit 58, including resistors R2 and R1. As illustrated in FIG. 4, the control unit monitors the voltage ($V_{tamper}$) at node 66 of the voltage sensing circuit 58 through a communication line 68 and the resistor R9.

Referring back to FIG. 8, once the $V_{control}$ has been turned off after the test period, the control unit delays for a sensing period 70 prior to determining at step 72 whether the $V_{tamper}$ signal has a high value. The sensing period in the preferred embodiment of the invention is approximately 25 ms, which assures that when the control unit determines whether the $V_{tamper}$ is high in step 72, the control unit is monitoring the discharge of the regulating capacitor 44, rather than the voltage of the energy storage device 52. This sensing period is required to make sure that both of the transistors Q2 and Q3 have turned off and that the voltage present at node 66 is solely the result of the discharge of the regulating capacitor 44 rather than residual voltage present due to the energy storage device 52.

Referring back to FIG. 8, if the control unit determines in step 72 that the $V_{tamper}$ has a high value, the control unit indicates in step 74 that a power outage has been detected rather than meter tampering. As described previously with reference to FIG. 4, the $V_{tamper}$ signal will be high only when the regulating capacitor 44 has been charged, which signifies that the resistor R3 is present, thus indicating that the meter is still present within the meter socket.

However, if the control unit determines in step 72 that the $V_{tamper}$ signal is not high, the control unit signals in step 74 that the meter has been removed from the meter socket. Referring back to FIG. 4, if the resistor R3 has been removed, signifying that the meter has been removed from the meter socket, the regulating capacitor 44 cannot be charged by the energy storage device 52 and thus will not discharge through the voltage sensing circuit 58. Since the regulating capacitor 44 will not discharge, the $V_{tamper}$ detected by the control unit will be low, signifying that the meter has been removed from the meter socket.

In the embodiment of the invention illustrated, the control unit 48 can signify meter tampering in numerous different fashions, such as providing a visual indication on the meter itself, sending a tamper signal using a radio device or setting an internal flag within the meter that can be interrogated at a later time. Thus, as described above, after power has been interrupted to the meter, the tamper detection circuit 46 utilizes the voltage regulating device 38 of the electricity meter to determine whether the electricity meter has been removed from the meter socket. As described above, the control unit makes a single determination as to whether the electricity meter has been removed from the socket following the detection of power interruption to the electricity meter.

As illustrated in FIGS. 3 and 4, when the electricity meter 10 is installed within the meter socket, the regulating capacitor 44 has a connection to ground both through the load side of the meter, specifically through the electrical circuitry contained within the subscriber location and the supply side of the meter, through the secondary winding 34 of the pole transformer 30. Thus, if the power supply lines on the supply side of the meter have been severed, the meter will not signal a tampering event since the regulating capacitor 44 can still be charged through the ground connection at the subscriber location. Likewise, if the electricity meter and meter socket are disconnected from the subscriber location and a power outage is detected, the regulating capacitor 44 can still be charged through the connection to ground through the second winding of the pole transformer.

As described above in the description of FIGS. 4 and 8, when the control unit 48 detects a power failure, which is indicated by the removal of the voltage source 50, the control unit 48 begins the required steps to determine whether the interruption in power is due to meter tampering. Initially, the control unit 48 delays for greater than the discharge time (t) of the capacitor 44, which is defined by (R1+R2) C, thereby allowing the capacitor 44 to fully discharge.

After the delay to allow the capacitor 44 to fully discharge, the control unit 48 generates a control voltage $V_{control}$ to the base 56 for a charging period greater than the amount of time required to charge the capacitor 44, which is determined by (R4)·(C1). If the electricity meter is installed in the socket, the capacitor 44 is charged by the voltage from the energy storage device 52. If the electricity meter is removed from the socket, the capacitor is not connected to ground and cannot be charged.

After the expiration of the charging period, the control voltage is removed from the base 56 of the transistor Q2 and the voltage at node 66 of the voltage divider created by R2 and R1 is tested. The voltage at node 66 is tested more quickly than the discharge time (t) of the capacitor 44. If the voltage at node 66 is high, this indicates that the meter is in the socket, since the resistor R3 is present. However, if the voltage at node 66 is low, this indicates the meter has been removed, since the resistor R3 is not present thus preventing charging of the capacitor 44. Thus, the procedure of the present disclosure is able to monitor for the removal of the electricity meter from the socket after a power failure.

Figure 5:
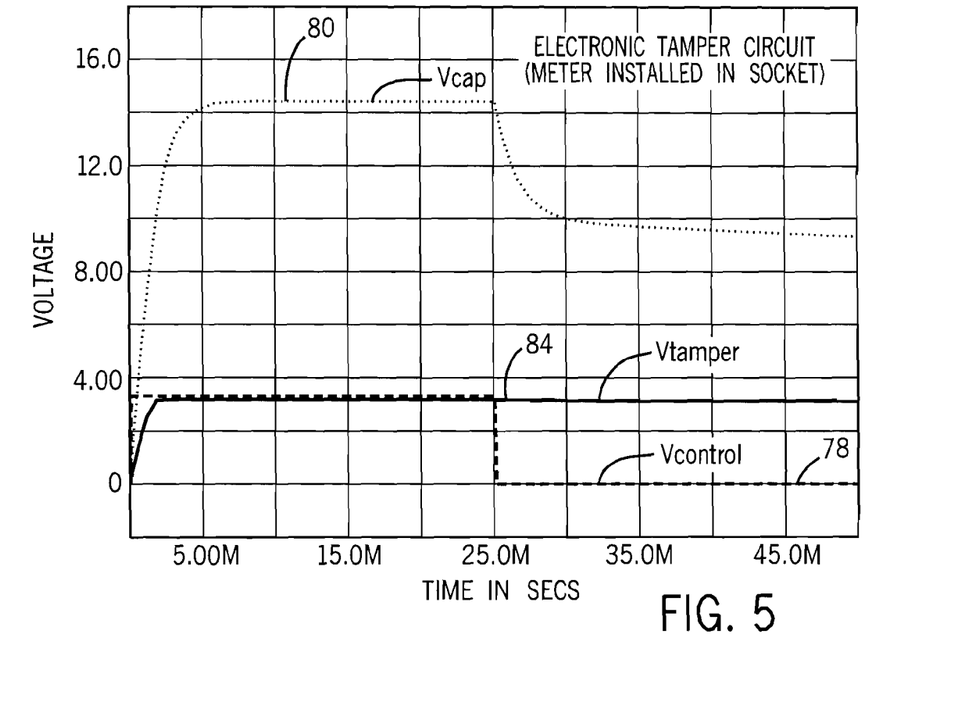
FIG. 5 is a timing graph illustrating the voltage levels taken at different points within the tamper detection circuit when the meter is installed in the meter socket.
Figure 6:
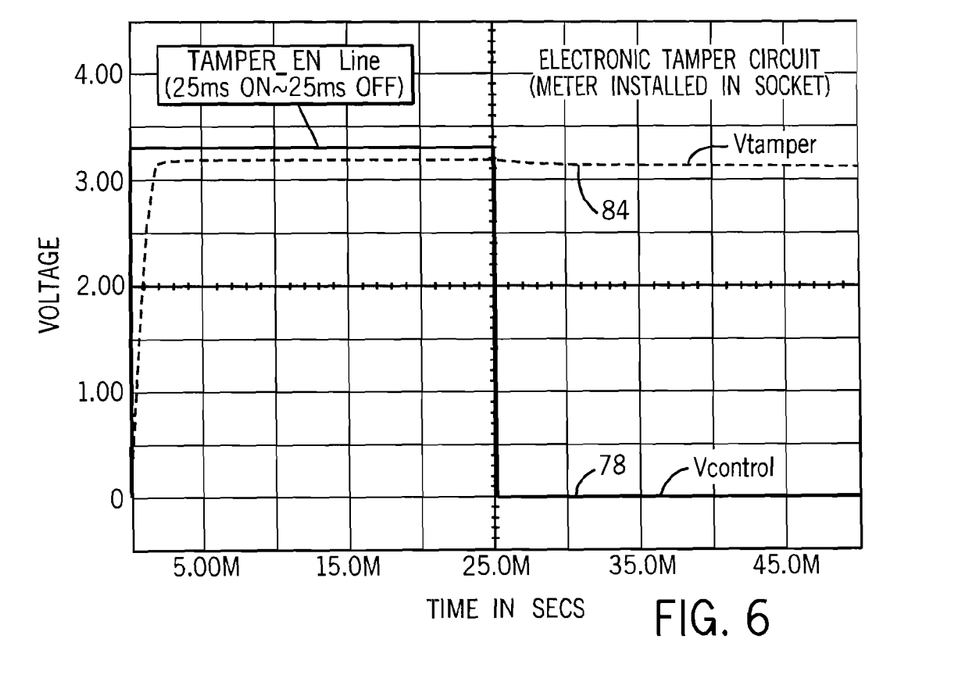
FIG. 6 is a magnified view illustrating the transition of the control voltage within the tamper detection circuit.
Figure 7:
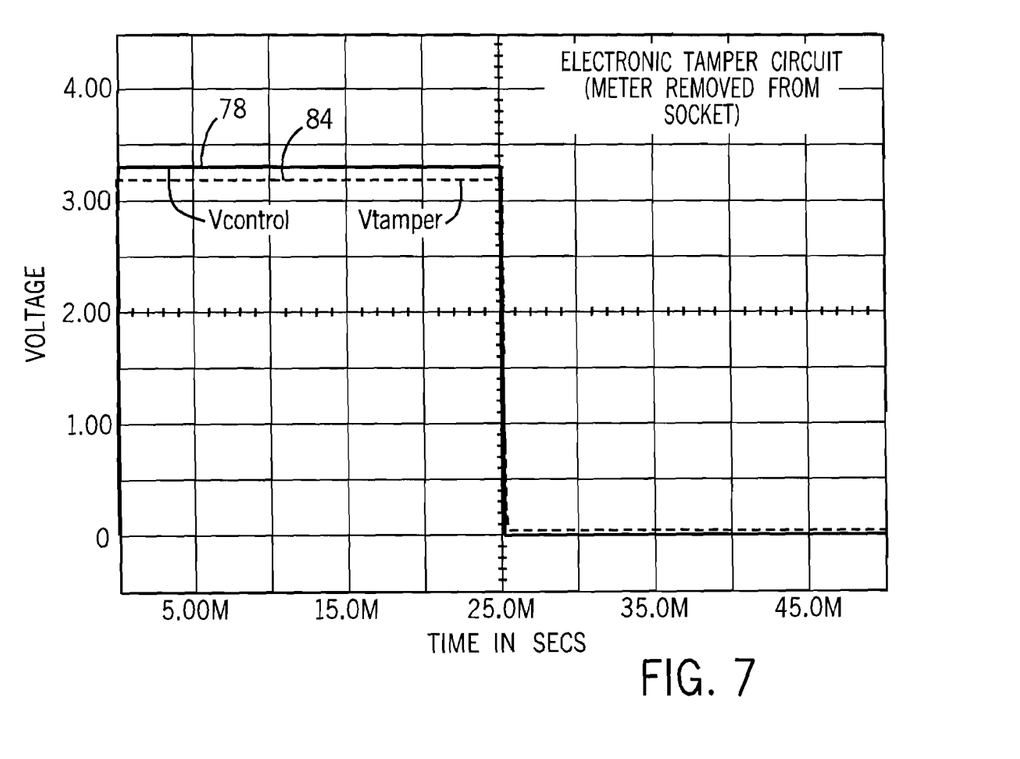
FIG. 7 is a timing graph illustrating the transition of both the tamper voltage and control voltage when the electricity meter is removed from the meter socket.

FIGS. 5-7 illustrate the actual voltages sensed in the tamper detection circuit 46 shown in FIG. 4 with the meter installed within the meter base and removed from the meter base. Referring first to FIG. 5, following the interruption in electrical power to the electricity meter and the six second delay period, the control unit generates the four volt control voltage $V_{control}$ 78 for the test period of 25 ms. When the control voltage has a high value, the voltage applied to the regulating capacitor 44, $V_{cap}$ 80 rises slightly above 14 volts and charges the regulating capacitor 44. As illustrated in FIG. 4, the voltage $V_{cap}$ is monitored by the control unit 48 through control line 82.

At the same time the regulating capacitor 44 is being charged, the voltage $V_{tamper}$ at node 66 is defined by the voltage sensing circuit 58 and has a high value of approximately 3.3 volts, as illustrated by the $V_{tamper}$ 84 shown in FIG. 5.

As illustrated in FIGS. 5 and 6, after the expiration of the test period, the control unit returns the $V_{control}$ 78 to zero volts, which turns off transistors Q2 and Q3. Once the transistors Q2 and Q3 have been turned off, if the meter is installed within the base, the regulating capacitor 44 is fully charged and begins to discharge through the voltage sensing circuit 58. The control unit senses the discharge of the capacitor 44 as the voltage $V_{tamper}$ 84. As illustrated in FIGS. 5 and 6, upon the removal of the $V_{control}$, the voltage $V_{tamper}$ at node 66 remains generally constant as the regulating capacitor 44 discharges. At the end of the sensing period, which is 25 ms after the transition to zero volts for the $V_{control}$, the voltage $V_{tamper}$ remains at approximately 3.3 volts, which is the value sensed by the control unit 48. Thus, if the meter remains installed in the base, the voltage $V_{tamper}$ will have a high value at the end of the test cycle.

Referring now to FIG. 7, when the meter has been removed from the meter socket, the voltage $V_{tamper}$ directly follows the voltage $V_{control}$ since the regulating capacitor 44 cannot be charged due to the removal of the resistor R3 from the circuit shown in FIG. 4. Thus, at the end of the test period, the voltage $V_{tamper}$ will have a value of zero volts, thus indicating to the control unit 48 that the electricity meter has been removed from the meter socket.

Although the preferred embodiment of the invention has been shown with the voltage regulating device 38 being a regulating capacitor 44, it should be understood that various other types of voltage regulating devices other than a single capacitor could be utilized while falling within the scope of the present invention. Further, although the switching device 53 shown in FIG. 4 illustrates a pair of transistors Q2 and Q3, various other switching devices positioned between the voltage source 50 and the regulating capacitor 44 could be utilized while operating within the scope of the present invention.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A tamper detection circuit for detecting the removal of an electricity meter from a meter socket connected between a voltage source and an electrical load at a subscriber location, the tamper detection circuit comprising:
   a voltage regulating device positioned between the voltage source and the electrical load for regulating the voltage source to provide an output voltage from the meter to the electrical load, the voltage regulating device being operable only when the electricity meter is installed in the socket;
   a switching device positioned between the voltage source and the voltage regulating device, the switching device being operable between an open condition and a closed condition, wherein the voltage source is disconnected from the voltage regulating device when the switching device is in the open condition;
   a voltage sensing circuit connected to the voltage regulating device to provide a discharge path for the voltage regulating device when the switching device is in the open condition; and
   a control unit coupled to the switching device and the voltage sensing circuit, wherein the control unit is operable to control the condition of the switching device between the open condition and the closed condition and monitor the voltage sensing circuit when the switching device is in the open condition.

2. The tamper detection circuit of claim 1 wherein the control unit is operable to monitor for the presence of the voltage source and position the switching device in the open condition upon an absence of the voltage source.

3. The tamper detection circuit of claim 2 wherein the switching device includes at least one transistor coupled to the control unit, the control unit being operable to provide a control voltage to the transistor to cause the switching device to be in the closed condition.

4. The tamper detection circuit of claim 3 wherein the voltage regulating device is a regulating capacitor coupled to the voltage source.

5. The tamper detection circuit of claim 4 wherein the control unit includes an energy storage device operable to charge the regulating capacitor upon detection of the absence of the voltage source.

6. The tamper detection circuit of claim 4 wherein the voltage sensing circuit is connected to the regulating capacitor to provide the discharge path and to sense the charge on the regulating capacitor.

7. The tamper detection circuit of claim 6 wherein the control unit is operable to indicate meter tampering following the absence of the voltage source and no charge detected on the regulating capacitor.

8. A tamper detection circuit for detecting the removal of an electricity meter from a meter socket connected between a voltage source and an electrical load at a subscriber location, the tamper detection circuit comprising:
   a regulating capacitor positioned between the voltage source and the electrical load for regulating the voltage source to provide an output voltage from the meter to the electrical load, wherein the regulating capacitor can be charged only when the electricity meter is installed in the socket;
   a switching device positioned between the voltage source and the voltage regulating device, wherein the voltage source is disconnected from the regulating capacitor when the searching device is in an open condition;
   an energy storage device operable to selectively charge the regulating capacitor;
   a voltage sensing circuit connected to the regulating capacitor to provide a discharge path for the regulating capacitor; and
   a control unit coupled to the switching device and the voltage sensing circuit, wherein the control unit is operable to connect the energy storage device to the regulating capacitor upon detection of the absence of the voltage source, wherein the control unit is operable to determine the removal of the electricity meter from the meter socket based upon the charging of the regulating capacitor by the energy storage device.

9. The tamper detection circuit of claim 8 wherein the control unit is operable to indicate meter tampering following the absence of the voltage source and no charge detected on the regulating capacitor.

10. The tamper detection circuit of claim 8 wherein the control unit is operable to monitor for the presence of the voltage source and position the switching device in the open condition upon an absence of the voltage source.

11. The tamper detection circuit of claim 10 wherein the switching device includes at least one transistor coupled to the control unit, the control unit being operable to provide a control voltage to the transistor to cause the switching device to be in the closed condition.

* * * * *